(12) United States Patent
Ishibashi

(10) Patent No.: US 9,194,903 B2
(45) Date of Patent: Nov. 24, 2015

(54) SURFACE POTENTIAL MEASURING APPARATUS AND SURFACE POTENTIAL MEASURING METHOD

(71) Applicant: EBARA CORPORATION, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 154 days.

(21) Appl. No.: 14/197,101

(22) Filed: Mar. 4, 2014

(65) Prior Publication Data

US 2014/0253136 A1  Sep. 11, 2014

(30) Foreign Application Priority Data

Mar. 6, 2013  (JP) ................................. 2013-044267

(51) Int. Cl.
*G01N 27/60* (2006.01)
*G01R 29/12* (2006.01)
*H01L 21/66* (2006.01)
*G01R 31/28* (2006.01)

(52) U.S. Cl.
CPC ............ *G01R 29/12* (2013.01); *G01R 31/2831* (2013.01); *H01L 22/14* (2013.01); *H01L 2924/0002* (2013.01)

(58) Field of Classification Search
CPC ............................ G01R 29/12; G01R 31/2831
See application file for complete search history.

(56) References Cited

U.S. PATENT DOCUMENTS

| | | | | |
|---|---|---|---|---|
| 4,675,071 A | * | 6/1987 | Matsumoto | B01D 9/005 117/206 |
| 5,151,659 A | * | 9/1992 | Tanaka | G01N 27/60 324/457 |
| 5,216,362 A | * | 6/1993 | Verkuil | G01R 31/2831 250/492.2 |
| 5,241,276 A | * | 8/1993 | Tanaka | G01N 27/60 324/452 |
| 5,570,031 A | * | 10/1996 | Sasaki | G01R 29/12 257/E21.531 |
| 8,695,108 B2 | * | 4/2014 | Takeshi | G01Q 30/14 850/1 |
| 2009/0140143 A1 | * | 6/2009 | Fukuda | H01J 37/026 250/311 |
| 2013/0271110 A1 | * | 10/2013 | Yamanaka | G01N 27/00 324/72 |
| 2015/0253354 A1 | * | 9/2015 | Giraudet | B82Y 35/00 850/18 |

FOREIGN PATENT DOCUMENTS

| | | |
|---|---|---|
| JP | 08-075807 | 3/1996 |
| JP | 09-243692 | 9/1997 |
| JP | 11-211770 | 8/1999 |
| JP | 3225579 | 8/2001 |
| JP | 2002-365322 | 12/2002 |
| JP | 4064533 | 1/2008 |
| JP | 4068127 | 1/2008 |
| JP | 2008-076213 | 4/2008 |

* cited by examiner

*Primary Examiner* — Jermele M Hollington
(74) *Attorney, Agent, or Firm* — Baker & Hostetler LLP

(57) ABSTRACT

An apparatus for measuring a surface potential of an object on an underlying structure is disclosed. A relatively-moving mechanism moves a probe and a second support member relative to each other until the probe faces a reference structure on the second support member, an electric potential measuring device measures the surface potential of the reference structure through the probe, the controller calibrates the electric potential measuring device such that a measured value of the surface potential of the reference structure becomes 0, the relatively-moving mechanism moves the probe and a first support member relative to each other until the probe faces the object on the first support member after the calibration, and the electric potential measuring device measures the surface potential of the object through the probe.

9 Claims, 5 Drawing Sheets

SURFACE POTENTIAL MEASURING APPARATUS AND SURFACE POTENTIAL MEASURING METHOD

CROSS REFERENCE TO RELATED APPLICATION

This document claims priority to Japanese Patent Application No. 2013-44267 filed Mar. 6, 2013, the entire contents of which are hereby incorporated by reference.

BACKGROUND

In a manufacturing process of a semiconductor device, various films having different physical properties are formed on a silicon substrate and these films are subjected to various processes, thus forming fine metal interconnects. For example, in a damascene interconnect forming process, interconnect trenches are formed in a film, and the interconnect trenches are then filled with metal. Thereafter, an unnecessary metal is removed by chemical mechanical polishing (CMP), so that metal interconnects are formed. A variety of films including a metal film, a barrier film, and a dielectric film exist on a surface of the substrate that has been manufactured through such a damascene interconnect forming process.

A CMP apparatus (polishing apparatus) for polishing a substrate is typically configured to not only polish a substrate, but also clean and dry the polished substrate. Cleaning of the substrate is performed by bringing a cleaning tool, such as a roll sponge, into sliding contact with the substrate while rotating the substrate. After cleaning of the substrate, ultrapure water (DIW) is supplied onto the rotating substrate, thereby rinsing the substrate. Before the substrate is dried, the ultrapure water is further supplied onto the rotating substrate to rinse the substrate.

It is commonly known that the ultrapure water, to be supplied onto the rotating substrate, has a high specific resistance value ($\geq$15M $\Omega\cdot$cm) and that the surface of the substrate is electrostatically charged by the contact with the ultrapure water. Practically, experiments have confirmed that the surface of the substrate, on which metal interconnects and dielectric films are formed, is electrostatically charged as a result of the contact with the ultrapure water. Possible causes of such a phenomenon of the electrostatic charge may include the fact that the ultrapure water has a high specific resistance value and that the ultrapure water forms a flow on the rotating substrate, although the causes are uncertain. The electrostatic charge of the substrate surface may cause reattachment of particles that have been once removed by the cleaning process of the substrate surface, and may cause destruction of devices due to electrostatic discharge. Further, in devices having copper interconnects, copper (Cu) itself is liable to migrate under the influence of the surface charge, and may be attached to a dielectric film. Consequently, shortcut between the interconnects or leakage of current may occur, and/or poor adhesion between the copper interconnects and the dielectric film may occur.

Since the electrostatic charge of the substrate surface can lower a reliability of the devices, it is necessary to measure an amount of static electricity, i.e., a surface potential, and monitor it. However, a conventional device for measuring the surface potential of the substrate is very expensive. As a result, device fabrication costs will increase. Moreover, the surface potential of the substrate is likely to change due to various external factors. For example, separation charge, induction charge, and atmospheric charge may affect measurement of the surface potential of the substrate. Consequently, it has been difficult to precisely measure an accurate surface potential so far.

SUMMARY OF THE INVENTION

An apparatus and a method capable of measuring an accurate surface potential of an object, such as a film on a substrate, with low costs are provided.

In an embodiment, an apparatus and a method for measuring a surface potential of a dielectric film or a device containing a dielectric film and metal interconnects are provided.

In an embodiment, the apparatus for measuring a surface potential of an object on an underlying structure, includes: a probe; an electric potential measuring device configured to measure the surface potential through the probe; a first support member configured to support the underlying structure; a second support member configured to support a reference structure having the same construction as the underlying structure; a ground wire configured to ground the first support member and the second support member, a relatively-moving mechanism configured to move the probe and the first support member relative to each other and to move the probe and the second support member relative to each other; and a controller configured to control operations of the electric potential measuring device and the relatively-moving mechanism. The controller is configured to command the relatively-moving mechanism to move the probe and the second support member relative to each other until the probe faces the reference structure on the second support member, command the electric potential measuring device to measure the surface potential of the reference structure through the probe, calibrate the electric potential measuring device such that a measured value of the surface potential of the reference structure becomes 0, command the relatively-moving mechanism to move the probe and the first support member relative to each other until the probe faces the object after the calibration, and command the electric potential measuring device to measure the surface potential of the object through the probe.

In an embodiment, the controller is configured to command the relatively-moving mechanism to move the probe and the second support member relative to each other again until the probe faces the reference structure on the second support member after the surface potential of the object is measured, command the electric potential measuring device to measure the surface potential of the reference structure to obtain a measured value of the surface potential of the reference structure again, and determine whether or not the measured value that has been obtained again is within a predetermined range.

In an embodiment, the apparatus further includes an ionizer configured to eliminate static electricity from an ambient atmosphere surrounding the object and the reference structure.

In an embodiment, the apparatus further includes a static electricity measuring device configured to measure the static electricity in the ambient atmosphere surrounding the object and the reference structure, wherein the controller is configured to control an operation of the ionizer such that a measured value of the static electricity falls within a predetermined target range.

In an embodiment, the first support member and the second support member are made of the same electrically conductive material.

In an embodiment, a method of measuring a surface potential of an object on an underlying structure supported by a first support member, includes: moving a probe and a second support member relative to each other until the probe faces a reference structure supported by the second support member, the reference structure having the same construction as the underlying structure; measuring the surface potential of the reference structure through the probe using an electric potential measuring device, with the second support member grounded; calibrating the electric potential measuring device such that a measured value of the surface potential of the reference structure becomes 0; after the calibration, moving the probe and the first support member relative to each other until the probe faces the object; and then measuring the surface potential of the object through the probe using the electric potential measuring device, with the first support member grounded.

In an embodiment, the method further includes after measuring the surface potential of the object, moving the probe and the second support member relative to each other again until the probe faces the reference structure; measuring the surface potential of the reference structure to obtain a measured value of the surface potential of the reference structure again; and determining whether or not the measured value that has been obtained again is within a predetermined range.

In an embodiment, measuring the surface potential of the object and measuring the surface potential of the reference structure are performed while eliminating static electricity from an ambient atmosphere surrounding the object and the reference structure.

In an embodiment, measuring the surface potential of the object and measuring the surface potential of the reference structure are performed while measuring the static electricity in the ambient atmosphere surrounding the object and the reference structure and eliminating the static electricity from the ambient atmosphere such that a measured value of the static electricity is within a predetermined target range.

According to the above-described embodiments, the electric potential measuring device is calibrated based on the measured value of the surface potential of the reference structure before measuring the surface potential of the object. Since the reference structure has the same construction as the underlying structure lying under the object, the surface potential of the underlying structure is cancelled by the calibration. Therefore, the electric potential measuring device can accurately measure the surface potential of the object through the probe. Elements that constitute the apparatus, including the probe and the electric potential measuring device, can be available at low prices on the market. Therefore, it is possible to provide the surface potential measuring apparatus with a low price.

DETAILED DESCRIPTION

Figure 1:
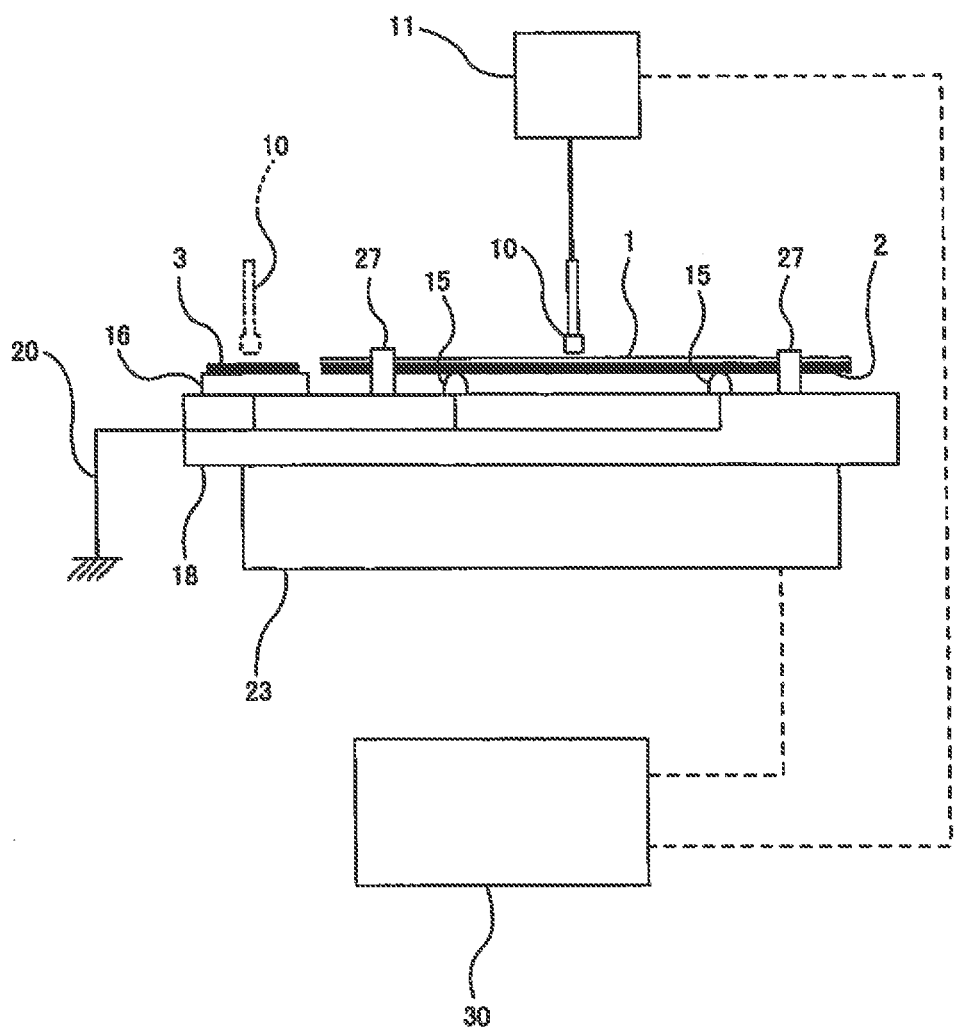
FIG. 1 is a side view showing an embodiment of a surface potential measuring apparatus.
Figure 2:
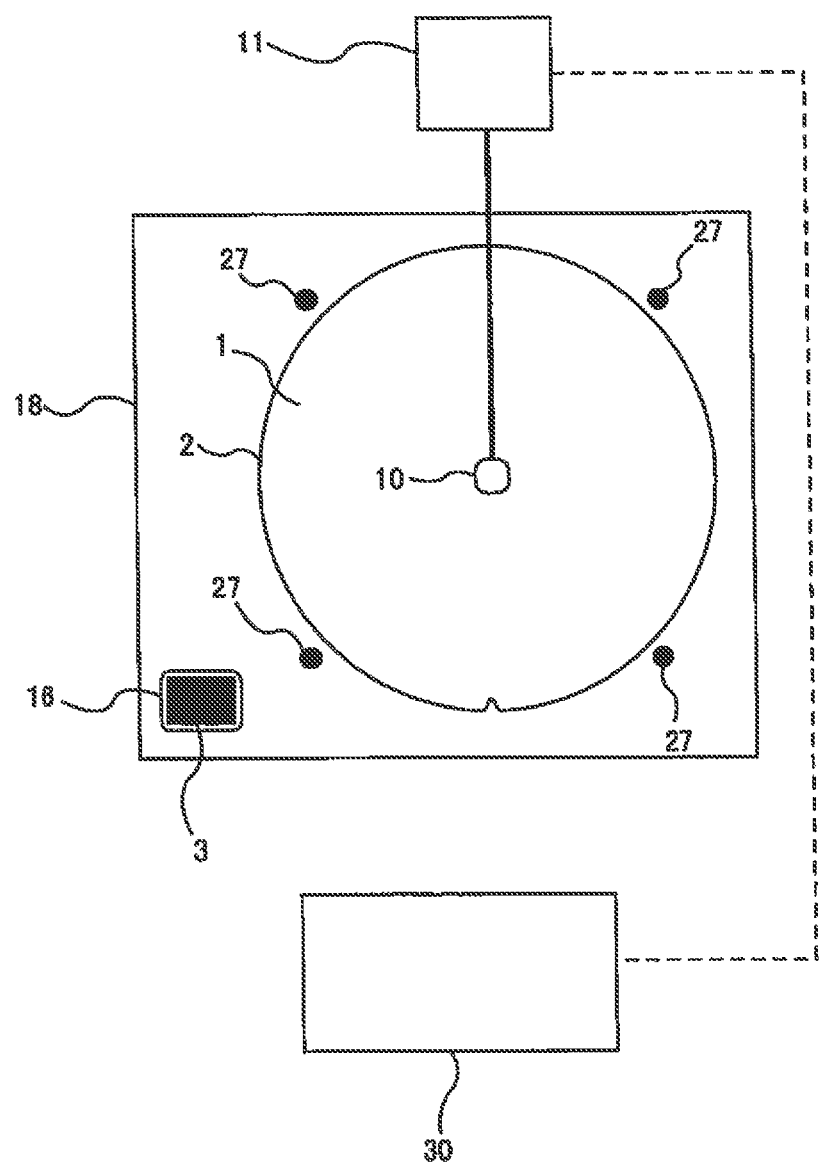
FIG. 2 is a plan view showing the surface potential measuring apparatus.

An embodiment will be described below with reference to the drawings. FIG. 1 is a side view showing an embodiment of a surface potential measuring apparatus, and FIG. 2 is a plan view showing the surface potential measuring apparatus. The surface potential measuring apparatus includes a probe 10, an electric potential measuring device 11 coupled to the probe 10, a first support member 15 for supporting an underlying structure 2 on which a film 1 (which is an object to be measured) is formed, and a second support member 16 for supporting a reference structure 3. The first support member 15 and the second support member 16 are secured to an upper surface of a measurement table 18.

The underlying structure 2 may be a silicon substrate having a diameter ranging from 25 mm to 450 mm. The object to be measured may be a dielectric film or a device having a dielectric film and metal interconnects formed on the silicon substrate. For example, the underlying structure 2 shown in FIG. 2 is a silicon substrate having a notch, and the object, which is denoted by reference numeral 1, is a dielectric film (blanket film) formed on the silicon substrate. It is noted, however, that the underlying structure 2 and the object 1 are not limited to these examples. The underlying structure 2 is supported by the first support member 15 with the film 1 facing upward. In the case of the silicon substrate, the silicon substrate may preferably be placed on the first support member 15 with the notch facing toward a predetermined direction, as shown in FIG. 2.

The reference structure 3 is placed on the second support member 16 before measurement of a surface potential is started. This reference structure 3 has the same construction and the same material as those of the underlying structure 2. For example, in the case where the underlying structure 2 is a silicon substrate, the reference structure 3 is also a silicon substrate. In the case where the underlying structure 2 is a multilayer structure having an upper layer A and a lower layer B, the reference structure 3 is also a multilayer structure having an upper layer A and a lower layer B. In this manner, the reference structure 3 is determined depending on the underlying structure 2.

The first support member 15 and the second support member 16 are made of the same electrically conductive material. For example, the first support member 15 and the second support member 16 are made of copper or gold. Preferably, the first support member 15 and the second support member 16 are made of copper or gold plated with chromium or nickel. The first support member 15 and the second support member 16 are grounded through a ground wire 20. The first support member 15 is in contact with a lower surface of the underlying structure 2, and the second support member 16 is in contact with a lower surface of the reference structure 3. Therefore, the surface potential of the underlying structure 2 and the reference structure 3 is 0 V. The measurement table 18 is made of an electrically conductive material, such as metal, and is grounded through the ground wire 20.

The first support member 15 and the second support member 16 preferably have the same height. More specifically, a height of an upper surface of the underlying structure 2 supported by the first support member 15 is preferably the same as a height of an upper surface of the reference structure 3 supported by the second support member 16.

As shown in FIG. 1, the film 1, which is the object to be measured, is formed on the upper surface of the underlying structure 2. The probe 10 and the electric potential measuring device 11 are configured to measure the surface potential (or an amount of static electricity) [V] of the object based on a Kelvin probe method. The probe 10 (which may also be called Kelvin probe) and the electric potential measuring device 11 used in this embodiment are available on the market. The probe 10 is disposed above the film 1 on the underlying structure 2 that is supported by the first support member 15. The probe 10 is supported by a member (not shown) and fixed in its position. The film 1 and the probe 10 are kept noncontact. A distance between the film 1 and the probe 10 is in a range of 0.50 mm to 2.00 mm, for example.

Figure 3:
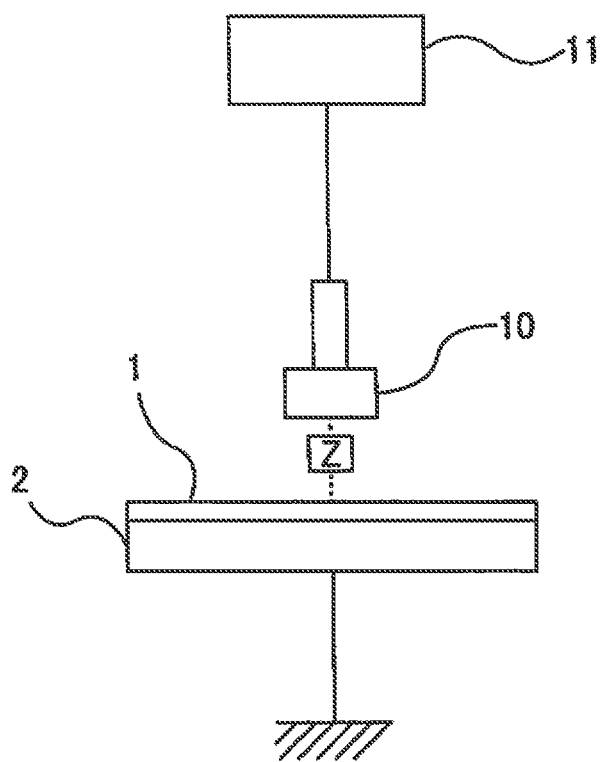
FIG. 3 is a schematic view illustrating the principle of measuring a surface potential of a film by a probe and an electric potential measuring device without contacting the film.

FIG. 3 is a schematic view illustrating the principle of measuring the surface potential of the film 1 by the probe 10 and the electric potential measuring device 11 without contacting the film 1. When the probe 10 is located near the film (i.e., the object to be measured) 1, a sensor electrode in a distal end of the probe 10 and the film 1 are equivalently coupled to each other through an impedance Z. In this state, a capacitance C is created between the probe 10 and the film 1. An electric potential is generated in the probe 10 so as to cancel the capacitance C, so that the probe 10 and the surface of the film 1 have the same electric potential. This electric potential indicates a value depending on the surface potential of the film 1. Therefore, the probe 10 and the electric potential measuring device 11 can measure the surface potential of the film 1 without contacting the film 1.

Figure 4:
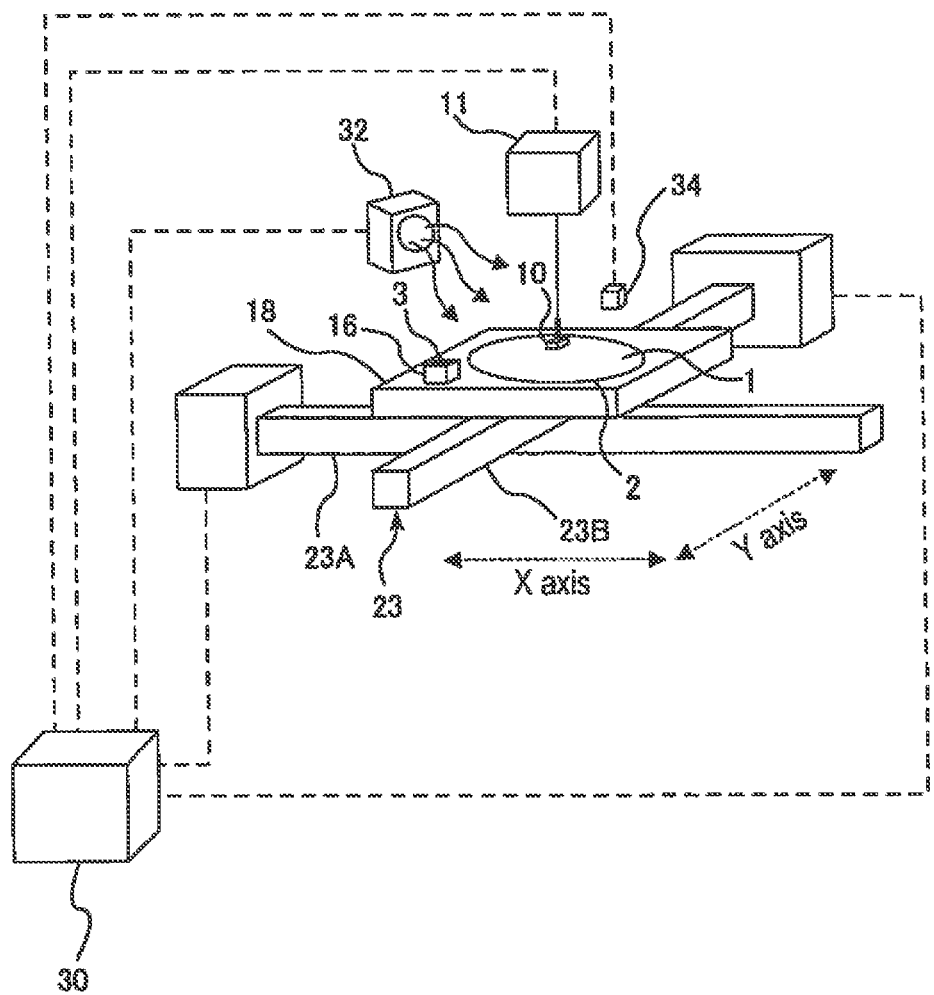
FIG. 4 is a perspective view showing the surface potential measuring apparatus.

FIG. 4 is a perspective view showing the surface potential measuring apparatus. As shown in FIG. 4, the surface potential measuring apparatus has a relatively-moving mechanism 23 for moving the probe 10 and the first support member 15 relative to each other and moving the probe 10 and the second support member 16 relative to each other. More specifically, the relatively-moving mechanism 23 includes a combination of an X-axis moving mechanism 23A and a Y-axis moving mechanism 23B which are configured to move the measurement table 18 horizontally. The X-axis moving mechanism 23A is arranged so as to move the measurement table 18 along an X axis, and the Y-axis moving mechanism 23B is arranged so as to move the measurement table 18 along a Y axis which is perpendicular to the X axis. Each of the X-axis moving mechanism 23A and the Y-axis moving mechanism 23B is constituted by a ball screw mechanism and a servomotor for driving the ball screw mechanism. The X-axis moving mechanism 23A and the Y-axis moving mechanism 23B enable the probe 10 to automatically measure the surface potential at one or a plurality of predetermined (or programmed) measurement points on the surface of the film 1 (i.e., point(s) on a X-Y coordinate system). A controller 30, coupled to the electric potential measuring device 11 and the relatively-moving mechanism 23, is configured to produce a static electricity distribution on the surface of the film 1 based on measured values obtained.

The relatively-moving mechanism 23 can move both the underlying structure 2 on the first support member 15 and the reference structure 3 on the second support member 16 together in the same horizontal plane. As described above, the position of the probe 10 is fixed. The relatively-moving mechanism 23 moves the underlying structure 2 and the reference structure 3 until the probe 10 faces either the film 1 or the reference structure 3. In another example, the relatively-moving mechanism 23 may move, instead of the measurement table 18, the probe 10 in a horizontal plane. In still another example, the relatively-moving mechanism 23 may move both the measurement table 18 and the probe 10 independently of each other.

As shown in FIG. 2, a plurality of stopper pins 27, arranged along a peripheral edge of the underlying structure 2, are secured to the measurement table 18. These stopper pins 27 serve as movement restriction members for prevent the underlying structure 2 and the film 1 from moving relative to the first support member 15 when the relatively-moving mechanism 23 is moving the first support member 15 horizontally. The stopper pins 27 are made of resin and are located slightly away from the underlying structure 2 on the first support member 15.

The stopper pins 27 may be arranged in contact with the underlying structure 2. In this case, the stopper pins 27 are made of the same electrically conductive material (e.g., copper or gold) as the first support member 15 and the second support member 16. Preferably, the stopper pins 27 may be made of copper or gold plated with chromium or nickel. The stopper pins 27, made of the electrically conductive material, are grounded through the ground wire 20 as well as the first support member 15 and the second support member 16.

As shown in FIG. 1 through FIG. 4, the surface potential measuring apparatus further has the controller 30 for controlling operations of the electric potential measuring device 11 and the relatively-moving mechanism 23. This controller 30 is configured to control the operations of the electric potential measuring device 11 and the relatively-moving mechanism 23 in accordance with operation sequences that are programmed in advance.

An ionizer 32 is provided adjacent to the measurement table 18. This ionizer 32 is a corona-discharge ionizer configured to generate positive ions and negative ions and supply the ions into a space over the film 1 to thereby neutralize unbalanced electric charge in an ambient atmosphere including the space over the film 1 and the reference structure 3. A static electricity measuring device 34 is disposed above the film 1 with a distance from the film 1 by 10 mm to 200 mm. The static electricity measuring device 34 is configured to measure a static electricity in the ambient atmosphere including the space over the film 1 and the reference structure 3. The static electricity measuring device 34 is coupled to the controller 30, and a measured value of the static electricity is sent to the controller 30. This controller 30 performs a feedback control of the ionizer 32 such that the measured value of the static electricity in the ambient atmosphere including the space over the film 1 and the reference structure 3 falls within a predetermined target range of −1.0 V to 1.0 V.

Figure 5:
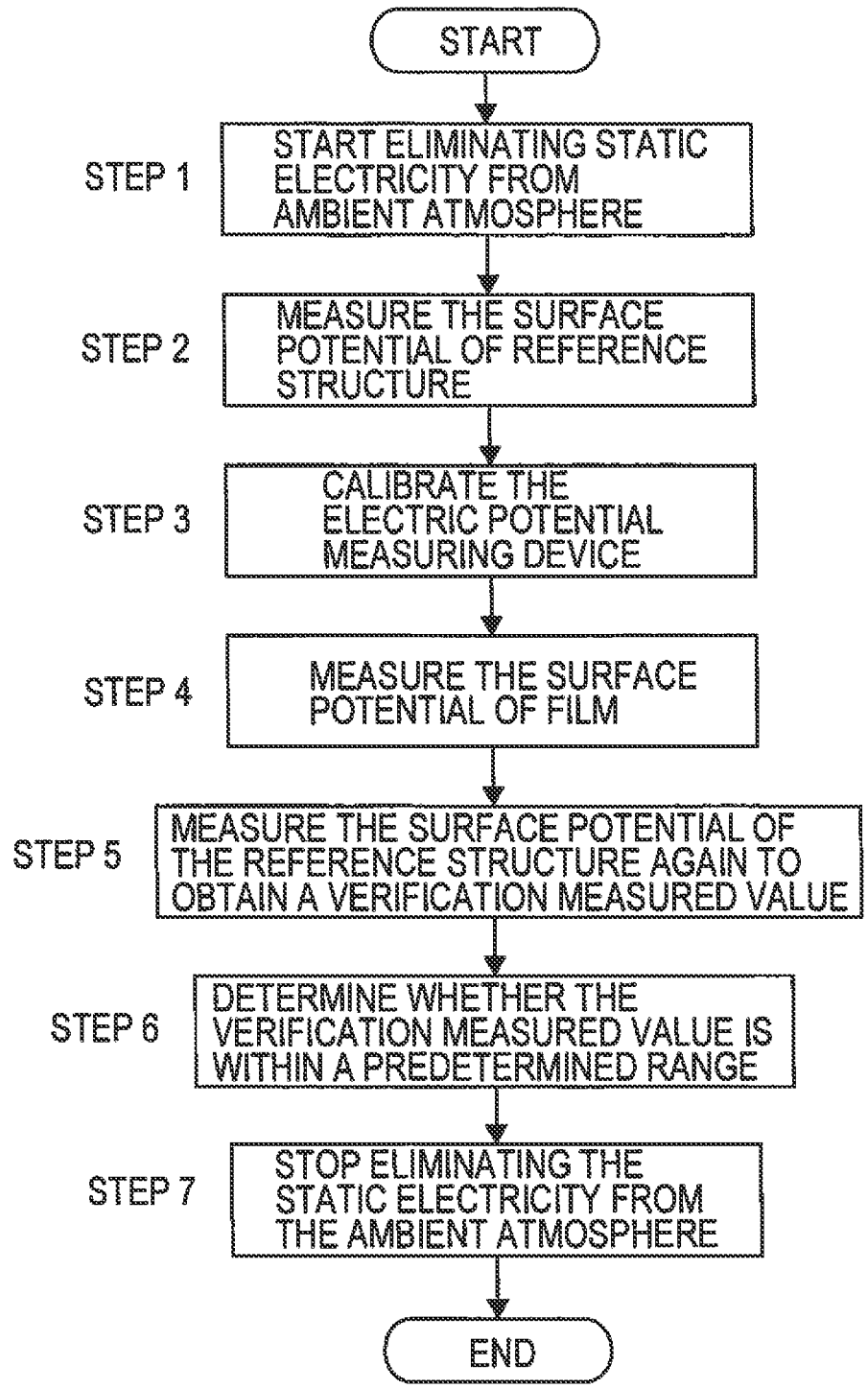
FIG. 5 is a flowchart showing a process of measuring the surface potential.

Next, an operation of the surface potential measuring apparatus will be described with reference to FIG. 5. FIG. 5 is a flowchart showing a process of measuring the surface potential. In this diagram, the underlying structure (substrate) 2 is placed on the first support member 15 by a conductive hand (not shown) which can prevent the electrostatic charge. It is also possible to use an automatic transporter for placing the underlying structure (substrate) 2 on the first support member 15.

The operations and the operation sequence, which will be described below, are controlled by the controller 30. At step 1, the ionizer 32 is actuated to eliminate the static electricity in the ambient atmosphere surrounding the film 1 and the reference structure 3. The operation of the ionizer 32 is controlled by the controller 30 based on the measured value of the static electricity obtained by the static electricity measuring device 34. For example, the operation of the ionizer 32 is controlled such that the measured value of the static electricity falls within the range of −1.0 V to 1.0 V.

If the measured value of the static electricity is within the range of −1.0 V to 1.0 V, then the relatively-moving mechanism 23 moves the reference structure 3 until the probe 10 is located above the reference structure 3. With the probe 10 facing the reference structure 3, the electric potential measuring device 11 measures the surface potential of the reference structure 3 through the probe 10 (step 2). The measured value of the surface potential of the reference structure 3 is sent to the controller 30. The controller 30 calibrates the electric potential measuring device 11 automatically such that the measured value of the surface potential of the reference structure 3 becomes 0.00 [V] (step 3).

Next, the relatively-moving mechanism 23 moves the underlying structure 2 until the probe 10 is located above the film 1 on the underlying structure 2. With the probe 10 facing the film 1, the electric potential measuring device 11 measures the surface potential of the film 1 through the probe 10 (step 4). The electric potential measuring device 11 may preferably measure the surface potential of the film 1 multiple times to obtain a plurality of measured values and calculate an average of the plurality of measured values. The surface potential of the film 1 may be measured at predetermined plural measurement points. For example, the surface potential of the film 1 may be measured at plural measurement points arrayed along a radial direction of the film 1. Further, the surface potential of the film 1 may be measured over the film 1 in its entirety.

After the measurement of the surface potential of the film 1, the relatively-moving mechanism 23 moves the reference structure 3 until the probe 10 is located above the reference structure 3 again. With the probe 10 facing the reference structure 3, the electric potential measuring device 11 measures the surface potential of the reference structure 3 through the probe 10 to obtain a measured value again (step 5). Hereinafter, this measured value obtained again will be referred to as a verification measured value (i.e., a measured value for verification). The verification measured value is sent to the controller 30. The controller 30 determines whether or not the verification measured value falls within a predetermined range (step 6). If the verification measured value falls within the predetermined range, the measured value of the surface potential of the film 1 is determined to be a reliable measured value. If the verification measured value is not within the predetermined range, the controller 30 generates an alarm indicating occurrence of a measurement error.

After the verification measured value is obtained, the operation of the ionizer 32 is stopped, and the elimination of the static electricity from the ambient atmosphere is stopped (step 7). In this manner, the ionizer 32 is in operation at all times while the surface potentials of the film 1 and the reference structure 3 are measured. Therefore, the ionizer 32 can eliminate the effect of the spatial charge.

In order to measure the surface potential more accurately, a humidity of the ambient atmosphere is preferably not more than 60%. Further, the relatively-moving mechanism 23 is preferably installed on an electrically conductive base which is grounded. In addition, the surface potential measuring apparatus is preferably surrounded by an antistatic partition wall (e.g., an antistatic curtain).

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. An apparatus for measuring a surface potential of an object on an underlying structure, the apparatus comprising:
   a probe;
   an electric potential measuring device configured to measure the surface potential through the probe;
   a first support member configured to support the underlying structure;
   a second support member configured to support a reference structure having the same construction as the underlying structure;
   a ground wire configured to ground the first support member and the second support member;
   a relatively-moving mechanism configured to move the probe and the first support member relative to each other and to move the probe and the second support member relative to each other; and
   a controller configured to control operations of the electric potential measuring device and the relatively-moving mechanism,
   the controller being configured to
      command the relatively-moving mechanism to move the probe and the second support member relative to each other until the probe faces the reference structure on the second support member,
      command the electric potential measuring device to measure the surface potential of the reference structure through the probe,
      calibrate the electric potential measuring device such that a measured value of the surface potential of the reference structure becomes 0,
      command the relatively-moving mechanism to move the probe and the first support member relative to each other until the probe faces the object after the calibration, and
      command the electric potential measuring device to measure the surface potential of the object through the probe.

2. The apparatus according to claim 1, wherein the controller is configured to
   command the relatively-moving mechanism to move the probe and the second support member relative to each other again until the probe faces the reference structure on the second support member after the surface potential of the object is measured,
   command the electric potential measuring device to measure the surface potential of the reference structure to obtain a measured value of the surface potential of the reference structure again, and
   determine whether or not the measured value that has been obtained again is within a predetermined range.

3. The apparatus according to claim 1, further comprising:
   an ionizer configured to eliminate static electricity from an ambient atmosphere surrounding the object and the reference structure.

4. The apparatus according to claim 3, further comprising:
   a static electricity measuring device configured to measure the static electricity in the ambient atmosphere surrounding the object and the reference structure,
   wherein the controller is configured to control an operation of the ionizer such that a measured value of the static electricity falls within a predetermined target range.

5. The apparatus according to claim 1, wherein the first support member and the second support member are made of the same electrically conductive material.

6. A method of measuring a surface potential of an object on an underlying structure supported by a first support member, the method comprising:
   moving a probe and a second support member relative to each other until the probe faces a reference structure supported by the second support member, the reference structure having the same construction as the underlying structure;

measuring the surface potential of the reference structure through the probe using an electric potential measuring device, with the second support member grounded;

calibrating the electric potential measuring device such that a measured value of the surface potential of the reference structure becomes 0;

after the calibration, moving the probe and the first support member relative to each other until the probe faces the object; and then measuring the surface potential of the object through the probe using the electric potential measuring device, with the first support member grounded.

7. The method according to claim 6, further comprising:

after measuring the surface potential of the object, moving the probe and the second support member relative to each other again until the probe faces the reference structure;

measuring the surface potential of the reference structure to obtain a measured value of the surface potential of the reference structure again; and determining whether or not the measured value that has been obtained again is within a predetermined range.

8. The method according to claim 6, wherein measuring the surface potential of the object and measuring the surface potential of the reference structure are performed while eliminating static electricity from an ambient atmosphere surrounding the object and the reference structure.

9. The method according to claim 8, wherein measuring the surface potential of the object and measuring the surface potential of the reference structure are performed while measuring the static electricity in the ambient atmosphere surrounding the object and the reference structure and eliminating the static electricity from the ambient atmosphere such that a measured value of the static electricity is within a predetermined target range.

* * * * *